(12) United States Patent
Nguyen

(10) Patent No.: US 8,072,235 B2
(45) Date of Patent: Dec. 6, 2011

(54) INTEGRATED CIRCUIT WITH CONFIGURABLE ON-DIE TERMINATION

(75) Inventor: Huy Nguyen, San Jose, CA (US)

(73) Assignee: Rambus Inc., Sunnyvale, CA (US)

( * ) Notice: Subject to any disclaimer, the term of this patent is extended or adjusted under 35 U.S.C. 154(b) by 0 days.

(21) Appl. No.: 13/023,993

(22) Filed: Feb. 9, 2011

(65) Prior Publication Data

US 2011/0128041 A1   Jun. 2, 2011

Related U.S. Application Data

(63) Continuation of application No. 12/790,381, filed on May 28, 2010, which is a continuation of application No. 12/288,612, filed on Oct. 21, 2008, now Pat. No. 7,772,876, which is a continuation of application No. 11/313,054, filed on Dec. 19, 2005, now Pat. No. 7,439,760.

(51) Int. Cl.
*H03K 17/16* (2006.01)
(52) U.S. Cl. .......................... 326/30; 326/22
(58) Field of Classification Search ............ 326/21, 326/22, 23, 30, 82–87
See application file for complete search history.

(56) References Cited

U.S. PATENT DOCUMENTS

| | | | |
|---|---|---|---|
| 4,584,695 A | 4/1986 | Wong et al. ............ 375/81 |
| 4,590,396 A | 5/1986 | Koike ............... 307/572 |
| 5,254,883 A | 10/1993 | Horowitz ............ 307/443 |
| 5,298,800 A | 3/1994 | Dunlop ............ 307/270 |
| 5,396,028 A | 3/1995 | Tomassetti ............ 178/69 |
| 5,406,147 A | 4/1995 | Coyle ............... 327/51 |
| 5,467,455 A | 11/1995 | Gay et al. ............ 395/281 |
| 5,523,703 A | 6/1996 | Yamamoto et al. ......... 326/30 |
| 5,663,661 A | 9/1997 | Dillon ............ 326/30 |
| 5,666,078 A | 9/1997 | Lamphier et al. ......... 327/108 |
| 5,680,060 A | 10/1997 | Banniza ............ 326/30 |
| 5,726,582 A | 3/1998 | Hedberg ............ 326/30 |
| 5,781,028 A | 7/1998 | Decuir ............ 326/30 |
| 5,926,031 A | 7/1999 | Wallace ............ 326/30 |
| 5,969,658 A | 10/1999 | Naylor ............ 341/514 |
| 5,982,191 A | 11/1999 | Starr ............... 326/30 |
| 5,995,894 A | 11/1999 | Wendte ............ 701/50 |
| 6,028,484 A | 2/2000 | Cole ............ 330/295 |
| 6,040,714 A | 3/2000 | Klein ............ 326/86 |
| 6,060,907 A | 5/2000 | Vishwanthaiah et al. ....... 326/87 |
| 6,064,224 A | 5/2000 | Esch, Jr. ............ 326/30 |

(Continued)

FOREIGN PATENT DOCUMENTS

EP  0520687  12/1992

(Continued)

OTHER PUBLICATIONS

Khouri, Gaby "Evaluation of Alcatel Patent Portfolio by Semiconductor Insights." Nov. 2004. Copyright Semiconductor Insights Inc. 38 pages.

(Continued)

*Primary Examiner* — Don Le
(74) *Attorney, Agent, or Firm* — Silicon Edge Law Group LLP; Arthur J. Behiel

(57) ABSTRACT

Described are integrated-circuit die with differential receivers, the inputs of which are coupled to external signal pads. Termination legs coupled to the signal pads support multiple termination topologies. These termination legs can support adjustable impedances, capacitances, or both, which may be controlled using an integrated memory.

19 Claims, 3 Drawing Sheets

U.S. PATENT DOCUMENTS

| | | | | |
|---|---|---|---|---|
| 6,157,206 | A | 12/2000 | Taylor et al. | 326/30 |
| 6,232,792 | B1 | 5/2001 | Starr | 326/30 |
| 6,266,001 | B1 | 7/2001 | Fang | 341/144 |
| 6,288,564 | B1 | 9/2001 | Hedberg | 326/30 |
| 6,308,232 | B1 | 10/2001 | Gasbarro | 710/100 |
| 6,344,765 | B2 | 2/2002 | Taguchi | 327/333 |
| 6,353,334 | B1 | 3/2002 | Schultz et al. | 326/82 |
| 6,356,105 | B1 | 3/2002 | Volk | 326/30 |
| 6,356,106 | B1 | 3/2002 | Greef et al. | 326/30 |
| 6,366,128 | B1 | 4/2002 | Ghia et al. | 326/83 |
| 6,411,122 | B1 | 6/2002 | Mughal | 326/30 |
| 6,418,500 | B1 | 7/2002 | Gai et al. | 710/305 |
| 6,424,170 | B1 | 7/2002 | Raman | 326/30 |
| 6,448,813 | B2 | 9/2002 | Donnelly | 326/83 |
| 6,462,588 | B2 | 10/2002 | Lau | 327/108 |
| 6,462,591 | B2 | 10/2002 | Garrett, Jr. | 327/112 |
| 6,495,997 | B2 | 12/2002 | Hall et al. | 323/316 |
| 6,509,756 | B1 | 1/2003 | Yu | 326/30 |
| 6,525,558 | B2 | 2/2003 | Kim | 326/30 |
| 6,530,062 | B1 | 3/2003 | Donnelly | 716/2 |
| 6,545,522 | B2 | 4/2003 | Mughal | 327/334 |
| 6,552,565 | B2 | 4/2003 | Chang | 326/30 |
| 6,573,746 | B2 | 6/2003 | Kim | 326/30 |
| 6,573,747 | B2 | 6/2003 | Radhakrishnan | 326/30 |
| 6,608,507 | B2 | 8/2003 | Garrett, Jr. | 327/108 |
| 6,661,250 | B2 | 12/2003 | Kim | 326/30 |
| 6,711,073 | B2 | 3/2004 | Martin | 365/198 |
| 6,734,702 | B1 | 5/2004 | Ikeoku et al. | |
| 6,762,620 | B2 | 7/2004 | Jang et al. | 326/30 |
| 6,768,352 | B1 | 7/2004 | Maher | 327/112 |
| 6,781,405 | B2 | 8/2004 | Best | 326/30 |
| 6,806,728 | B2 | 10/2004 | Nguyen | 326/30 |
| 6,856,169 | B2 | 2/2005 | Frans | 326/82 |
| 6,888,370 | B1 | 5/2005 | Luo et al. | 326/30 |
| 6,894,691 | B2 | 5/2005 | Juenger | 345/531 |
| 6,924,660 | B2 | 8/2005 | Nguyen | 326/30 |
| 6,940,303 | B2 | 9/2005 | Vargas | 326/30 |
| 6,965,529 | B2 | 11/2005 | Zumkehr et al. | 365/189.05 |
| 6,968,413 | B2 | 11/2005 | Cranford | 710/300 |
| 6,980,020 | B2 | 12/2005 | Best | 326/30 |
| 6,981,089 | B2 | 12/2005 | Dodd et al. | 710/308 |
| 7,038,498 | B2 | 5/2006 | Funaba | 327/77 |
| 7,068,064 | B1 | 6/2006 | Yen | 326/30 |
| 7,102,200 | B2 | 9/2006 | Fan et al. | 257/379 |
| 7,102,390 | B2 | 9/2006 | Frans | 326/30 |
| 7,109,744 | B1 | 9/2006 | Shumarayev et al. | 326/30 |
| 7,120,390 | B2 * | 10/2006 | Grundvig et al. | 455/41.2 |
| 7,123,047 | B2 | 10/2006 | Lim | 326/30 |
| 7,135,884 | B1 | 11/2006 | Talbot | 326/30 |
| 7,148,721 | B2 | 12/2006 | Park | 326/30 |
| 7,151,390 | B2 | 12/2006 | Nguyen | 326/30 |
| 7,161,378 | B2 | 1/2007 | Kang et al. | 326/30 |
| 7,196,567 | B2 | 3/2007 | Nguyen | 327/308 |
| 7,245,146 | B2 | 7/2007 | Ishizuka et al. | 326/30 |
| 7,245,154 | B1 | 7/2007 | Davidson et al. | 326/82 |
| 7,268,712 | B1 | 9/2007 | Shen | 341/120 |
| 7,750,666 | B2 * | 7/2010 | Zhang et al. | 326/30 |
| 7,843,212 | B2 * | 11/2010 | Tanaka | 326/30 |
| 2001/0047450 | A1 | 11/2001 | Gillingham et al. | 711/105 |
| 2003/0112751 | A1 | 6/2003 | Yuffe et al. | 370/229 |
| 2004/0124850 | A1 | 7/2004 | Koneru | 324/601 |
| 2004/0189343 | A1 | 9/2004 | Jang | 326/30 |
| 2004/0201402 | A1 | 10/2004 | Rajan | 326/30 |
| 2005/0057275 | A1 | 3/2005 | Ngyuen | 326/30 |
| 2005/0225353 | A1 | 10/2005 | Kwon | 326/30 |
| 2006/0007761 | A1 | 1/2006 | Ware | 365/194 |
| 2006/0071683 | A1 | 4/2006 | Best | 326/30 |
| 2006/0077731 | A1 | 4/2006 | Ware | 365/194 |
| 2007/0007992 | A1 | 1/2007 | Bains et al. | 326/30 |
| 2007/0070717 | A1 | 3/2007 | Kim | 365/189.07 |

FOREIGN PATENT DOCUMENTS

| | | |
|---|---|---|
| EP | 0817441 | 1/1998 |
| JP | 02140676 | 5/1990 |
| TW | 2005-119471 | 12/2005 |
| WO | 97/02658 | 1/1997 |
| WO | 98/04041 | 1/1998 |
| WO | 00/41300 | 7/2000 |
| WO | 00/70474 | 11/2000 |
| WO | 02/063833 | 8/2002 |
| WO | 2004-061690 A3 | 7/2004 |

OTHER PUBLICATIONS

Black, Mike, "Xilinx/Micron Partner to Provide High-Speed Memory Interfaces." Xcell Journal, First Quarter 2005. 2 pages.

Gabara, Thaddeus J., "On-Chip Terminating Resistors for High Speed ECL-CMOS Interfaces." Feb. 1992. IEEE. pp. 292-295.

Micron, "Graphics DDR3 DRAM." Advance. "256 Mb x 32 GDDR3 DRAM." © 2003 Micron Technology, Inc. pp. 1-67.

Johnson, Chris. "The Future of Memory: Graphics DDR3 SDRAM Functionality." Micron Designline, vol. 11, Issue 4, 4Q02. 8 pages.

Gabara et al., "Digitally Adjustable Resistors in CMOS for High-Performance Applications," IEEE Journal of Solid-State Circuits, vol. 27, No. 8, Aug. 1992. 10 pages.

"Low-Voltage Differential Signaling." Copyright The International Engineering Consortium. Downloaded from Web ProForum Tutorials http://www.ied.org. 15 pages. Dec. 2005.

Huq, Syed B., et al., "An Overview of LVDS Technology." 1998 National Semiconductor Corporation. 12 pages.

Johnson, Chris, "Graphics DDR3 On-Die Termination and Thermal Considerations." Micron Designline, vol. 12, Issue 1. Rev. Apr. 1, 2003. 1Q03/2Q03. 8 pages.

"Achieving Flexible, High Performance I/O with RapidChip Platform ASICs." Copyright LSI Logic Corporation. 2005. 7 pages.

"LVDS Multidrop Connections, Application Report, Mixed Signal Products (SLLA054)." Copyright Texas Instruments. Jul. 1999. 37 pages.

Kim, Su-Chul, "Programmable Digital On-Chip Terminator." ITC-CSCC, 2002. 4 pages.

"Xilinx Digitally Controlled Impedance (DCI) Technology," Xilinx, Inc., VTT011(v1.1), pp. 1-3, Sep. 20, 2001.

Farrell, Todd, "Core Architecture Doubles MEM Data Rate," in Electronic Engineering Times Asia, Dec. 16, 2005. 4 pages.

512M bits DDR3 SDRAM, Preliminary Data Sheet, Elpida Memory, Inc. 2005-2006, Document No. E0785E11 (ver. 1.1), Feb. 2006, 4 pages, www.elpida.com.

Janzen, Jeff, "DDR2 Offers New Features and Functionality," Designline, vol. 12, Issue 2, Micron, 16 pages, Jul. 31, 2003 EN.L.

Weidlich, Rainer, "What comes Next in Commodity DRAMS—DDR3," Infineon Technologies, Jun. 2005, 4 pages.

Hynix and DDR3, Keynote Address at JEDEX Shanghai 2005, Oct. 2005, 24 pages.

Micron Technical Note, "DDR2-533 Memory Design Guide for Two-DIMM Unbuffered Systems," TN-47-01, 2003, 19 pages.

Shen, Dr. William Wu, Infineon Technologies, "System Challenges on DDR3 High Speed Clock/Address/Command Fly-by Bus Topology," JEDEX San Jose, Apr. 18, 2006, 47 pages.

Rhoden, Desi and Lee, D.Y., "DDR/DDR2/DDR3 SDRAM Tutorial Sponsored by," Samsung and Inphi, JEDEX San Jose, Oct. 25-26, 2005, 130 pages.

Rhoden, Desi "The Evolution of DDR," Via Technology Forum 2005, Inphi Corp., 23 pages. drhoden@inphi-copr.com.

Shen, Dr. William Wu, "DDR3 Functional Outlook," JEDEX San Jose, Apr. 2006, 31 pages.

Shen, Dr. William Wu, "DDR3 Functional Outlook," Infineon, JEDEX Shanghai, Oct. 25-26, 2005, 30 pages.

Lee, K.H., "MultimediaCard Solutions of Digital Storage Applications," Samsung Electronics, JEDEX Shanghai, Oct. 26, 2005, 28 pages.

Gervasi, Bill "DRAM Module Market Overview," SimpleTech, JEDEX Shanghai, Oct. 25-26, 2005, 50 pages.

Trost, Hans-Peter "Press Presentation DDR3 Introduction," Memory Products Group, InfineonTechnologies, AG, Jun. 2005, 11 pages.

Cao, T et al. "On-Chip Programmable Termination Scheme." IP.Com Prior Art Database—Technical Disclosure, Original Publication date. vol. 38 No. 2 Feb. 1, 1995 (4 Pages, last page was empty p. 486). (cover page and 483-485).

Micron Technical Note, TN-47-07: DDR2 Simulation Support; Rev A Jul. 2005, 4 pages.

DDR2 ODT Control; Product Planning & Application Engineering Team, Dec. 2004, pp. 8.

"Virtex-II Platform FPGAs: Functional Description," pp. 1-11, 35-39, Xilinx, Inc., Jun. 24, 2004 (16 pages).

"High Performance Switches, Silicon Switch, Product Line Detail," pp. 1-53, Pericom Semiconductor Corporation, Jul. 2004 (53 pages).

Ethirajan, Karthik, "Termination Techniques for High-Speed buses," EDN Magazine, Issue 04, Feb. 16, 1998 (9 pages).

Knight, Thomas F. et al., "Self Terminating Low Voltage Swing CMOS Output Driver," IEEE Journal of Solid-State Circuits, vol. 23, No. 2, Apr. 1988. 8 pages.

PCT/US2006/045966 International Preliminary report on Patentability (Chapter I of the Patent Cooperation treaty) dated Jul. 3, 2008. 12 pages.

U.S. Office Action with mail date of Nov. 12, 2009 for U.S. Appl. No. 12/288,612, filed Oct. 21, 2008. 12 pages.

Notice of Allowance and Fee(s) due with mail date of Apr. 2, 2010 re U.S. Appl. No. 12/288,612. 10 Pages.

Issue Notification for U.S. Appl. No. 12/288,612 dated Jul. 21, 2010. 1 page.

Non-Final Office Action with mail date of Aug. 4, 2010, in U.S. Appl. No. 12/790,381. 9 pages.

Information Disclosure Statement submitted on Aug. 23, 2010 re U.S. Appl. No. 12/790,381. 9 Pages.

Response dated Oct. 28, 2010 to the Office Action dated Aug. 4, 2010 re U.S. Appl. No. 12/790,381. 10 Pages.

Notice of Allowance and Fee(s) Due with mail date of Jan. 24, 2011 re U.S. Appl. No. 12/790,381 includes Information Disclosure Statement. 10 Pages.

Information Disclosure Statements submitted Feb. 2, 2011 re U.S. Appl. No. 12/790,381. 3 Pages.

"Serial ATA II: Electrical Specification," Dell Computer Corp., et al., Rev. 1, May 26, 2004. 187 pages.

DE Office Action dated Jun. 3, 2011 re DE Application No. 112006003478.2. 11 Pages.

"Serial ATA Revision 2.5", dated Oct. 2, 2005, Serial ATA International Organization. 587 Pages.

"Serial ATA", from Wikipedia dated Mar. 8, 2010. 10 Pages.

* cited by examiner

… (1)

INTEGRATED CIRCUIT WITH CONFIGURABLE ON-DIE TERMINATION

FIELD

The subject matter presented herein relates generally to the field of communications, and more particularly to high speed electronic signaling within and between integrated circuit devices.

BACKGROUND

High-speed data communication integrated circuit (IC) dies are known to include both drivers and receivers. The driver of one such IC connects to the receiver of another via one or more signal transmission lines. Both the driver and receiver circuits include termination elements that attempt to match the characteristic impedance of the transmission line to the output impedance of the driver and input impedance of the receiver, as impedance mismatches degrade signal quality and consequently reduce communication speed and reliability.

Some conventional communication systems employ control systems that calibrate the impedance of on-die termination (ODT) elements for improved impedance matching. These systems work well in many applications. Still, high-speed data communication circuits often must achieve ever-greater performance levels, at competitive prices, to satisfy customer demand. Furthermore, different customers typically have different requirements that may not be met by a given ODT configuration. One customer might favor power-efficiency over speed, or may prefer different termination voltages or impedances. There is therefore a need for ODT circuits that offer customers access to a broader range of termination topologies and values.

BRIEF DESCRIPTION OF THE DRAWINGS

The subject matter presented herein is illustrated by way of example, and not by way of limitation, in the figures of the accompanying drawings and in which like reference numerals refer to similar elements and in which.

DETAILED DESCRIPTION

Figure 1:
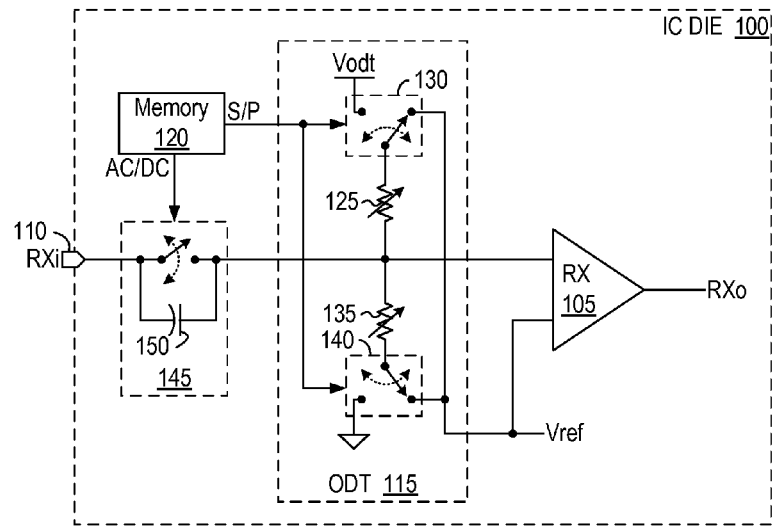
FIG. 1 depicts an integrated-circuit die 100 that includes configurable on-die termination in accordance with one embodiment.

FIG. 1 depicts an integrated-circuit (IC) die 100 in accordance with one embodiment. Die 100 includes a pseudo-differential receiver 105 that compares an input signal RXi, received via a pad 110, with a reference voltage Vref on a like-named voltage terminal or node to produce an output signal RXo. Die 100 also includes programmable on-die termination (ODT) circuitry 115 that can be programmed to provide either of two common termination topologies for high-speed communications: the so-called "rail-to-rail" topology and the so-called "half-supply" topology. The choice of termination topology is then left to the discretion of the user of IC die 100. An external source or internal memory 120 can deliver a signal S/P to temporarily or permanently select one of the two configurations.

ODT circuitry 115 includes two termination legs extending from the communication port between pad 110 and receiver 105. The upper termination leg includes a first termination impedance 125 and a first termination switch 130. Switch 130 includes three switch nodes, two of which are connected to supply voltage Vodt and reference voltage Vref, respectively. The third switch node is coupled to the communication port via termination impedance 125. The lower termination leg includes a second termination impedance 135 and a second termination switch 140 similar to switch 130. Two switch nodes of switch 140 are connected to ground and reference voltage Vref, respectively, while the third is coupled to the communication port via termination impedance 135. Both switches 130 and 140 are two position switches responsive to signal S/P from memory 120 to selectively couple one of the first and second switch nodes to the third switch node.

In rail-to-rail or serial terminations, the communication channel is coupled to each of two opposite supply voltages via a pair of termination impedances. To select a rail-to-rail termination topology, switches 130 and 140 are switched to supply nodes Vodt and ground, respectively. In that case, the input terminal to receiver 105 is coupled to Vodt and ground via respective impedances 125 and 135. Termination voltage Vodt on the like-named supply node is supply voltage Vdd in some embodiments, but may be a different fixed voltage or a variable voltage in other embodiments.

In half-supply or parallel terminations, the communication channel is coupled to a reference voltage between the two supply voltages. To select a half-supply termination topology, switches 130 and 140 are both switched to voltage Vref, in which case the input terminal to receiver 105 is coupled to the reference voltage terminal Vref via parallel impedances 125 and 135. As the name implies, the reference voltage in half-supply terminations is typically half the difference between the voltages on the supply nodes (e.g., Vref=½(Vdd−Gnd)), but voltage Vref may be a different fixed voltage or a variable voltage in other embodiments.

IC die 100 optionally includes a coupling switch 145 between pad 110 and the input terminal of receiver 105. An external or internal signal, such as from memory 120, can deliver a signal AC/DC to temporarily or permanently open or close switch 145. When switch 145 is closed, receiver 105 is DC coupled to pad 110: when open, receiver 105 is AC coupled to pad 110 via a capacitor 150.

Impedances 125 and 135 may be adjustable and capable of calibration. Suitable calibration methods and circuits are detailed in U.S. Pat. No. 6,924,660 entitled "Calibration Methods and Circuits for Optimized On-Die Termination," which is incorporated herein. Switches 130, 140, and 150 can be fashioned of transistors, as is well understood by those of skill in the art. Capacitor 150 may also be adjustable using methods and circuits detailed below in connection with FIG. 6.

Figure 2:
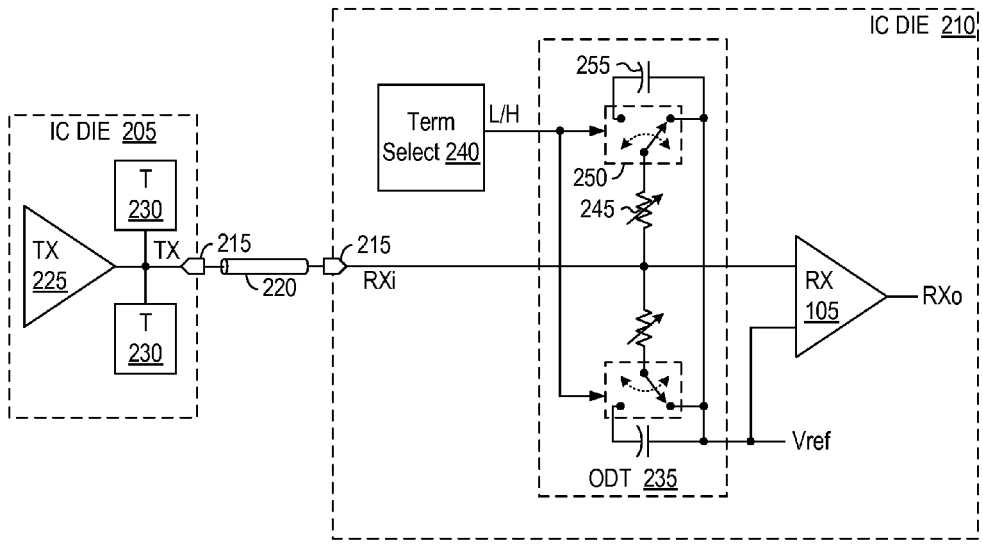
FIG. 2 depicts a communication system 200 that employs configurable on-die termination in accordance with another embodiment.

FIG. 2 depicts a communication system 200 in accordance with another embodiment. System 200 has features in common with IC die 100 of FIG. 1, like-numbered elements being the same or similar. System 200 includes ODT circuitry that can selectively introduce filter elements that may be useful for low power configurations. Further, the selection can be accomplished dynamically in some embodiments, which allows system 200 to select appropriate ODT characteristics for high and low-frequency communication. This flexibility is useful for example in systems that support both a low-frequency, power-saving mode and a high-frequency, high-performance mode.

System 200 includes a transmitter IC die 205 coupled to a receiver IC die 210 via a single-ended communication port made up of pads 215, a channel 220, and related conductors on dies 205 and 210. Die 205 includes a transmitter 225 and a pair of termination legs 230. Legs 230 may be the same or similar to the termination legs detailed in connection with the receiver dies 100 and 210 of FIGS. 1 and 2. Transmitter 225 conveys a signal TX to receiver 105 on die 210 via pad 215 and the other elements of the associated communication port.

IC die 210 includes ODT circuitry 235 that can select either a filtered or unfiltered half-supply termination topology. The termination topology is then left to the discretion of the user of IC die 210. The topology may be fixed, defined at start up, or allowed to change dynamically to support different performance modes. In the depicted embodiment, termination select logic 240 issues a control signal L/H, the state of which identifies either a lower-performance, lower-power mode, or a higher-performance, higher-power mode.

ODT circuitry 235 includes two termination legs extending from the communication port between pad 215 and receiver 105 of die 210. The upper termination leg includes a first termination impedance 245 and a first termination switch 250. Switch 250 includes three switch nodes, two of which are connected to reference voltage Vref, one directly and the other via a filter capacitor 255. The third switch node is coupled to the communication port via termination impedance 245. The lower termination leg is substantially the same. The switches of the upper and lower termination legs are responsive to signal L/H from termination select logic 240.

The switches of both termination legs connect their respective termination resistors directly to voltage node Vref in a high-performance mode, and to voltage node Vref via a respective filter capacitor in a low-frequency mode. Filtering the input signal in the low-frequency mode advantageously dampens high-frequency noise components. The filter capacitors may be adjustable in some embodiments to allow filter tuning. Fixed or adjustable resistors in series and/or in parallel with the filter capacitors can also be included.

Figure 3:
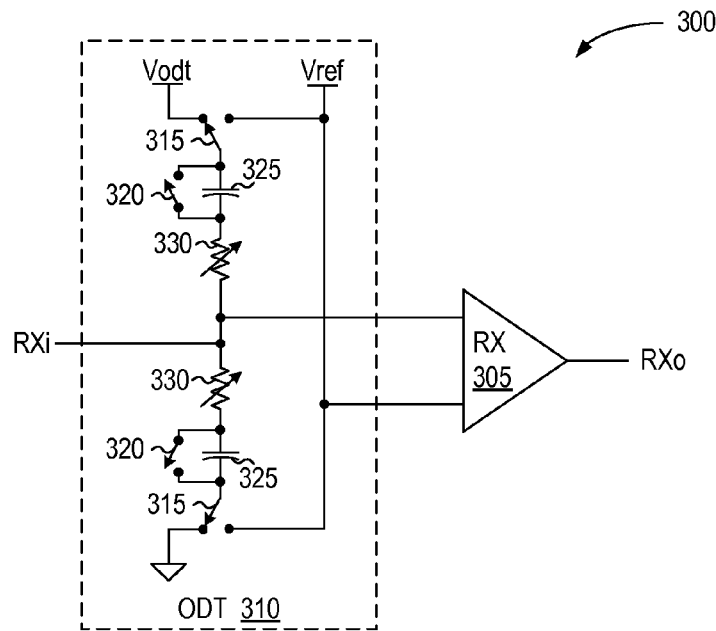
FIG. 3 depicts an IC die 300 in accordance with another embodiment.

FIG. 3 depicts an IC die 300 in accordance with another embodiment. Die 300 includes a receiver 305 that compares an input signal RXi with a reference voltage Vref on a like-named voltage node to produce an output signal RXo. Die 300 also includes programmable ODT circuitry 310 that can be programmed to provide filtered or unfiltered rail-to-rail or a half-supply termination topologies, and thus combines the functionality of the embodiments of FIGS. 1 and 2.

ODT circuitry 310 includes two termination legs. Each leg includes switches 315 and 320, a filter capacitor 325, and a termination impedance 330. Switches 315 and 320 support four modes as follows:

1. Unfiltered Rail-to-Rail: Switches 320 are closed and switches 315 of the upper and lower termination legs select nodes Vodt and Ground, respectively.
2. Filtered Rail-to-Rail: Switches 320 are open and switches 315 of the upper and lower termination legs select nodes Vodt and Ground, respectively.
3. Unfiltered Half-Supply: Switches 320 are closed and switches 315 both select node Vref.
4. Filtered Half-Supply: Switches 320 are open and switches 315 both select node Vref.

ODT circuitry 310 can be adapted to support more modes. Additional supply voltages can be supported, for example, and the impedances and capacitances can be adjustable.

Figure 4:
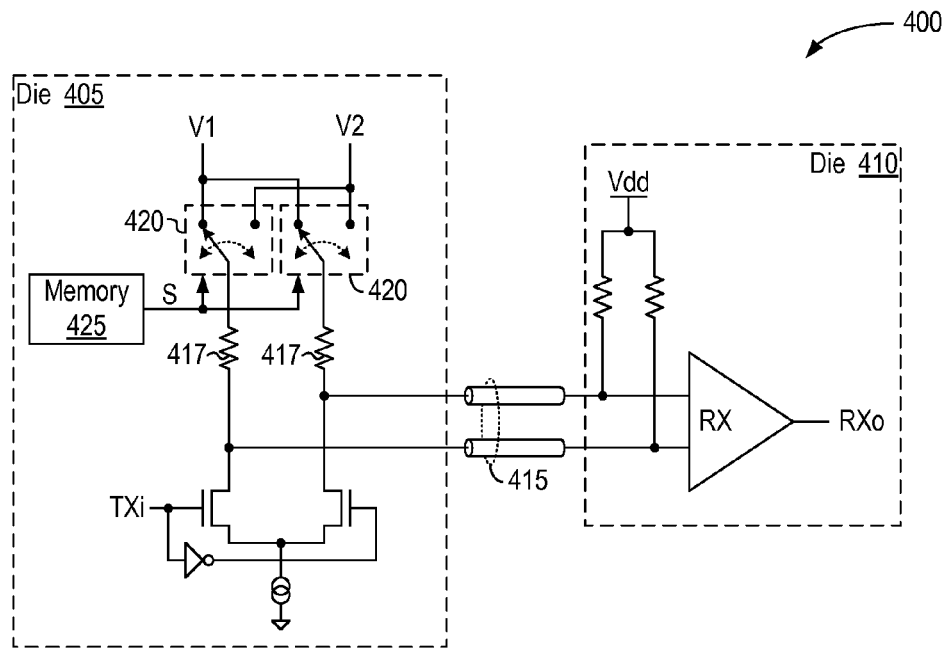
FIG. 4 depicts a communication system 400 that employs configurable ODT circuitry in accordance with another embodiment.

FIG. 4 depicts a communication system 400 that employs configurable ODT circuitry in accordance with another embodiment. The configurable ODT circuitry allows a transmitter die 405 to select between two or more termination voltages when transmitting data to a receiver die 410 over a differential communication channel 415. The resulting output common-mode voltage can thus be tailored to the needs of a receiver on die 410. If, for example, multiple receivers time-share a common bus but require or benefit from different receive termination voltages, then the associated transmitter or transmitters can use the termination voltage best suited for the receiver with which they are communicating. A communication channel may also support different operational modes that require or benefit from different termination voltages. A transmitter might, for example, support a loop-back communication mode for self test or initialization that employs a first termination voltage, and additionally support one or more operational modes that employ different termination voltages suitable for one or more target receivers.

Die 405 includes a differential transmitter with two identical or nearly identical termination legs. Each leg includes a fixed or adjustable termination impedance 417 and a voltage-select switch 420. The state of switches 420 are controlled using select signal S that may be provided externally or internally, as by a memory 425. Control logic can be included to dynamically alter the states of switches 420, which can alternatively select either of two termination voltages V1 and V2. In other embodiments, a variable voltage source is used in lieu of switches 420 and the two supply nodes.

Figure 5:
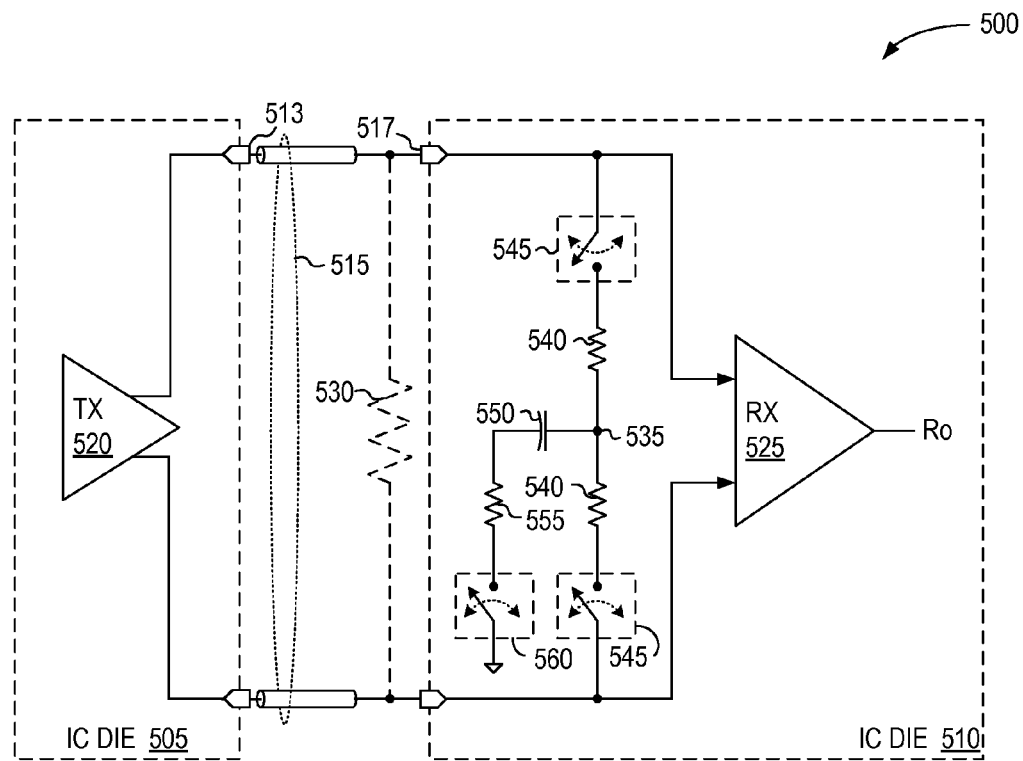
FIG. 5 depicts a communication system 500 in accordance with yet another embodiment.

FIG. 5 depicts a communication system 500 in accordance with yet another embodiment. Communication system 500 includes a transmitting die 505 communicating with a receiving die 510 via a differential channel 515. The transmitting die includes differential output pads 513 coupled via the channel to input pads 517 of the receiving die. In one embodiment, communication system 500 includes a transmitter 520 that employs low-voltage differential signaling (LVDS) for serial data transmission to a corresponding receiver 525, though other types of signaling may also be used. System 500 optionally includes an external differential termination resistor 530 (in phantom).

Die 510 includes programmable ODT circuitry that can select from a number of possible termination topologies. In support of this selectivity, die 510 includes three termination legs that extend from a common node 535, two to the differential input terminals to receiver 525 and one to a reference voltage node, e.g. ground. Each of the first two termination legs includes a termination impedance 540 and a switch 545 connected in series. The third termination leg includes a capacitance 550, a termination impedance 555, and a switch 560. The inclusion of impedances 540 and as associated switches 545 allows for the omission of external resistor 530. The third leg allows for the selective incorporation of a noise-reducing RC filter. The impedances and capacitance of the ODT circuitry of FIG. 5 are variable in some embodiments, which allows filter and termination values to be trimmed for improved performance. Switches 545 and 560 can be controlled by external or internal control signals applied to switch control terminals (not shown). The various capacitive and resistive elements can be similarly controlled.

Figure 6:
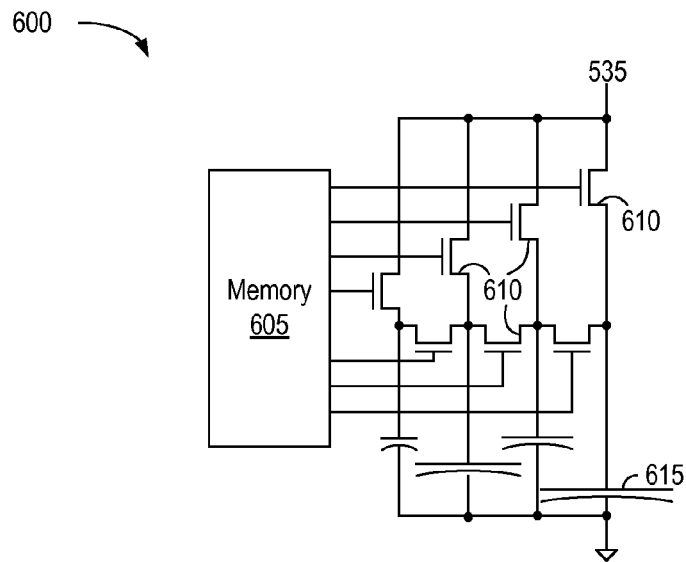
FIG. 6 depicts a configurable RC circuit 600 that can be used in place of the third termination leg of die 510 of FIG. 5, which extends between node 535 and ground.

FIG. 6 depicts a configurable RC circuit 600 that can be used in place of the third termination leg of die 510 of FIG. 5, which extends between node 535 and ground. Circuit 600 includes some memory 605, the outputs of which are coupled to the control terminals of a plurality of transistors 610. The transistors 610 selectively couple one or more differently sized capacitors 615 between node 535 and ground. In addition to controlling the capacitance, the resistance between nodes 535 and ground can be adjusted by selecting various combinations of transistors. The width-to-length ratios of transistors 610 may be varied to provide various impedances so that enabling different combinations of transistors provides different levels of termination impedance.

In the foregoing description and in the accompanying drawings, specific terminology and drawing symbols are set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. Similarly, signals described or depicted as having active-high or active-low logic levels may have opposite logic levels in alternative embodiments. As another example, circuits described or depicted as including metal oxide semiconductor (MOS) transistors may alternatively be implemented using bipolar technology or any other technology in which a signal-controlled current flow may be achieved. With respect to terminology, a signal is said to be "asserted" when the signal is driven to a low or high logic state (or charged to a high logic state or discharged to a low logic state) to indicate a particular condition. Conversely, a signal is said to be "de-asserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or de-asserts, if explicitly stated or indicated by context) the signal on a signal line coupled between the signal driving and signal receiving circuits.

An output of a process for designing an integrated circuit, or a portion of an integrated circuit, comprising one or more of the circuits described herein may be a computer-readable medium such as, for example, a magnetic tape or an optical or magnetic disk. The computer-readable medium may be encoded with data structures or other information describing circuitry that may be physically instantiated as an integrated circuit or portion of an integrated circuit. Although various formats may be used for such encoding, these data structures are commonly written in Caltech Intermediate Format (CIF), Calma GDS II Stream Format (GDSII), or Electronic Design Interchange Format (EDIF). Those of skill in the art of integrated circuit design can develop such data structures from schematic diagrams of the type detailed above and the corresponding descriptions and encode the data structures on computer readable medium. Those of skill in the art of integrated circuit fabrication can use such encoded data to fabricate integrated circuits comprising one or more of the circuits described herein.

While the present invention has been described in connection with specific embodiments, variations of these embodiments will be obvious to those of ordinary skill in the art. For example, the embodiments can be adapted for use with various single-ended and differential communication schemes over unidirectional and bidirectional channels. Specific examples include Series Stub Terminated Logic (SSTL) and double-data-rate (DDR) signaling, though this is by no means an exhaustive list. Embodiments may also be used for channels employing various modulation schemes, including those that employ multi-pulse-amplitude-modulation (multi-PAM) and single-PAM signals. Moreover, some components are shown directly connected to one another while others are shown connected via intermediate components. In each instance the method of interconnection, or "coupling," establishes some desired electrical communication between two or more circuit nodes, or terminals. Such coupling may often be accomplished using a number of circuit configurations, as will be understood by those of skill in the art. Therefore, the spirit and scope of the appended claims should not be limited to the foregoing description. Only those claims specifically reciting "means for" or "step for" should be construed in the manner required under the sixth paragraph of 35 U.S.C. Section 112.

What is claimed is:

1. An integrated circuit comprising:
   first and second input pads to couple to an external signal channel;
   a differential receiver having first and second differential input terminals coupled to the respective first and second input pads; and
   first and second termination legs extending from a respective one of the first and second differential input terminals to a common node, wherein each of the first and second termination legs selectively decouples the common node from the first and second termination legs.

2. The integrated circuit of claim 1, further comprising a third termination leg extending between the common node and a reference node.

3. The integrated circuit of claim 2, wherein the third termination leg selectively decouples the common node from the reference node.

4. The integrated circuit of claim 2, wherein the third termination leg exhibits an adjustable capacitance.

5. The integrated circuit of claim 4, further comprising a memory coupled to the third termination leg and to store a value to control the capacitance.

6. The integrated circuit of claim 2, wherein the third termination leg exhibits an adjustable impedance.

7. The integrated circuit of claim 6, further comprising a memory coupled to the third termination leg and to store a value to control the impedance.

8. The integrated circuit of claim 1, wherein the first termination leg includes a switch in series with a termination impedance.

9. The integrated circuit of claim 1, wherein the first and second termination legs exhibit respective controllable termination impedances.

10. An integrated circuit comprising:
    first and second input pads to couple to an external signal channel;
    a differential receiver having first and second differential input terminals coupled to the respective first and second input pads; and
    first and second termination legs extending from a respective one of the first and second differential input terminals to a common node, wherein each of the first and second termination legs includes means for selectively the respective one of the first and second differential input terminals from the common node.

11. The integrated circuit of claim 10, further comprising a third termination leg extending between the common node and a reference node.

12. The integrated circuit of claim 11, wherein the third termination leg includes means for selectively decoupling the common node from the reference node.

13. The integrated circuit of claim 11, wherein the third termination leg exhibits an adjustable capacitance, the integrated circuit further comprising means for adjusting the capacitance.

14. The integrated circuit of claim 13, wherein the means for adjusting the capacitance includes a memory.

15. The integrated circuit of claim 11, wherein the third termination leg includes means for adjusting an impedance through the third termination leg.

16. The integrated circuit of claim 15, wherein the means for adjusting the impedance includes a memory.

17. A computer-readable medium having stored thereon a data structure defining an integrated circuit, the data structure comprising:

first data representing first and second input pads to couple to an external signal channel;

second data representing a differential receiver having first and second differential input terminals coupled to the respective first and second input pads; and third data representing first and second termination legs extending from a respective one of the first and second differential input terminals to a common node, wherein each of the first and second termination legs is defined to selectively decouple the common node from the first and second termination legs.

18. The computer-readable medium of claim 17, further comprising forth data representing a third termination leg extending between the common node and a reference node.

19. The computer-readable medium of claim 18, wherein at least one of the first, second, and third termination legs is defined to include at least one of an adjustable impedance or an adjustable capacitance.

* * * * *